United States Patent [19]

Fetter et al.

[11] 4,370,359
[45] Jan. 25, 1983

[54] FABRICATION TECHNIQUE FOR JUNCTION DEVICES

[75] Inventors: Linus A. Fetter, Jackson; Richard E. Howard, Holmdel; Evelyn L. Hu, Somerset; Lawrence D. Jackel, Holmdel, all of N.J.

[73] Assignee: Bell Telephone Laboratories, Incorporated, Murray Hill, N.J.

[21] Appl. No.: 178,900

[22] Filed: Aug. 18, 1980

[51] Int. Cl.³ .............................................. B05D 5/12
[52] U.S. Cl. ........................................ 427/63; 427/99; 427/250; 427/251; 427/255.2; 427/255.5; 427/255.7; 204/192 D
[58] Field of Search ............. 427/63, 250, 251, 255.2, 427/255.5, 255.7, 96, 99; 204/192 D

[56] References Cited

U.S. PATENT DOCUMENTS

| | | | |
|---|---|---|---|
| 3,205,087 | 9/1965 | Allen | 427/43.1 |
| 3,288,637 | 11/1966 | Ames | 427/63 |
| 3,725,213 | 4/1973 | Pierce | 427/63 |
| 3,908,263 | 9/1975 | Matarese | 427/250 |
| 4,176,029 | 11/1979 | Jillie | 427/63 |
| 4,218,532 | 8/1980 | Dunkleberger | 430/312 |

OTHER PUBLICATIONS

Vossen et al., Thin Film Processes, pp. 175-176, 193, Academic Press Inc., N. Y., N. Y. ©1978.
Dolan, Applied Physics Letters, vol. 31, No. 5, pp. 337-339, Sep. 1977.
Greiner et al., IBM J. Res. and Dev., 24, 195 (1980).
Daalmans et al., Alternatives in Fabricating Submicron Niobium Josephson Junctions, American Institute of Physics Conference Proceedings, No. 44, 1978.

Primary Examiner—Michael R. Lusignan
Assistant Examiner—Richard Bueker
Attorney, Agent, or Firm—Bruce S. Schneider

[57] ABSTRACT

A self-aligning technique is used to produce small area junctions such as small area Josephson junctions. A base layer having a thickness corresponding to one dimension of the junction is first deposited. An insulating material is then deposited from a source positioned so that the base layer itself masks its edge from the insulator being formed. This procedure coats the base layer with an insulator, but leaves an edge of this layer free of insulation. A junction is then completed on this uncoated edge.

11 Claims, 3 Drawing Figures

FABRICATION TECHNIQUE FOR JUNCTION DEVICES

BACKGROUND OF THE INVENTION

1. Field of the Invention

This invention relates to the fabrication of devices and more particularly to the fabrication of junction devices.

2. Art Background

The physical intersection of two or more materials to form a junction is employed in many devices. For example, Josephson junctions are fabricated by depositing a superconducting material, oxidizing a surface of this material to produce an insulating layer, and depositing a second superconducting material over this insulating layer. The area of overlap of the two superconducting materials and the insulator forms a junction that has desirable electrical properties. It is often desirable to limit the area of the junction, i.e., the region of overlap. For example, in a Josephson device it is desirable to increase the conductance of the barrier to reduce hysteresis. This reduction of hysteresis is desirable since it generally yields faster switching times and simplifies the design of associated circuitry. However, to allow for greatly reduced hysteresis while maintaining the total device resistance at acceptable levels the junction area must be reduced significantly, i.e., reduced to smaller than $3 \times 10^{-9}$ cm$^2$ for typical devices.

Because submicron dimensions are required to produce the advantages associated with small area junctions, conventional lithographic techniques—techniques yielding dimensions on the order of 1 μm—are not useful. Various expedients have been employed to reduce the dimensions obtainable with conventional lithography. For example, a method suitable for producing small area junctions, has been developed by R. H. Havemann. [See *Journal of Vacuum Science and Technology*, 15, 389 (1978).] This method involves the deposition on a substrate of a first layer, e.g., a layer of nickel, having a thickness corresponding to one dimension of the junction to be formed. An insulating material, SiO, is then deposited on the major surface of the first layer. (A resist is used to delineate the area on the substrate on which the first layer is to be deposited. Since the height of the resist is greater than that of the first layer, the resist also ensures that the insulating material is deposited only on the major surface and not on the edge of the first layer. Thus, the resist both delineates the first layer and also masks its edges.) The resist is then removed and the exposed edge of the first layer is oxidized to form a thin barrier layer. The oxide is then covered with a second layer of material such as nickel having a desired width delineated by a second resist mask. This width is smaller than the width of the first layer. In this manner a junction is formed in the region where the first layer, the oxide, and the second layer overlap. The area of this overlap region, and thus the area of the junction, is determined by the thickness of the first layer and the width of the second layer. Since layers as thin as 10 nm are producible by standard techniques, the fabrication of small area junctions is possible.

However, methods such as described above for reducing the junction area have certain shortcomings. For example, after the first layer and insulating layer are deposited, the substrate is taken from the deposition apparatus, the resist material is removed, and the second resist pattern is formed. The substrate is returned to the vacuum system for oxidation of the edge of the first layer. The second layer of material is then deposited through the second resist pattern. Exposure to the ambient environment allows contamination of the edge of the first layer where the junction is ultimately to be formed. Resist residues left after processing of the resist also contaminate this surface. The devices produced by forming junctions on this contaminated surface generally are not acceptable. In the case of Josephson devices, to maintain the junction resistance while reducing the junction area, the specific conductance of the oxide must be correspondingly increased. To achieve this result with contaminated surfaces extensive cleaning procedures are necessary to remove the contamination before forming the oxide. These cleaning procedures introduce additional processing complexities and often lead to further complications.

SUMMARY OF THE INVENTION

By a carefully chosen sequence of processing steps, small area junctions, e.g., junctions having areas less than approximately $3 \times 10^{-9}$ cm$^2$, are produced without the difficulties associated with unacceptable levels of contamination. This result is attained without having to mask the edge of the first layer during fabrication and without having to expose the unfinished device to the ambient. Initially, a first material having a thickness that yields one dimension of the desired junction area is deposited. An insulating layer (a layer that during operation of the final device limits current flow through it to less than 50 percent of the total current flowing through the device) is then deposited on the major surface of this first material layer. This insulating material is deposited by maintaining a particular spatial relation between the first material layer and the incoming flux that forms the insulator. This is achieved by ensuring that the angle between the flux and the first material layer, e.g., 22 in FIG. 2, is smaller than the angle measured from the major surface of the first layer to a tangent to this layer at a point on the line, e.g., 14, defining the extremity of the area where the insulator is to be formed.

A preferred embodiment relies on a ballistic, i.e., not diffusion controlled, process for transporting the material from the source to the deposition region. In this embodiment the source of the insulating material is placed so that it is not within line of sight of any point on the edge of the first material within the area where the junction is to be formed. Upon deposition, the major surface of the first material layer is coated with the insulating layer, but its edge, although not masked, is unaffected. The still bare edge of the base material is then processed to form the desired junction. For example, in the case of Josephson junctions, the edge is oxidized and then a second material is deposited upon this oxide layer. Together with the thickness of the first layer the width of this layer determines the junction area. In this manner junctions having reduced contamination are produced. Additionally, irrespective of the resolution of the lithographic process employed during the device fabrication the attainable junction area is reducible by utilizing the subject edge-aligning technique. In the example of Josephson junction devices having areas as small as $10^{-9}$ cm$^{+2}$ exhibit excellent electrical properties and have significantly reduced hysteresis.

DETAILED DESCRIPTION

Figure 1:
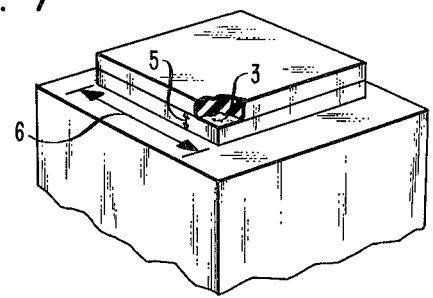
FIGS. 1-3 illustrate steps utilized in producing a device having a small junction area.

Use of the inventive process, which depends on an edge-aligning technique, yields small area junctions with a substantially reduced possibility of contamination. A layer of a first material is deposited on a substrate. The junction is built on an edge of this base layer. The dimensions of the edge determine the area of the junction which is ultimately formed. That is, the thickness of the base layer, 5 in FIG. 1, and the width of this layer, 6, substantially define the boundaries of the junction. (This statement assumes that the entire width of the edge is used to form the junction. However it is possible to employ only a portion of this width by using subsequent layers to complete the junction that are narrower in width. Thus the area is further reduced.)

Figure 2:
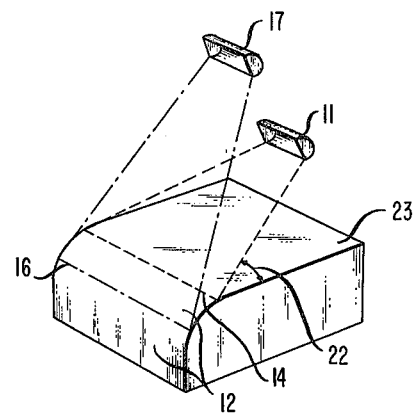

After deposition of the first layer of material, the major surface of this material, 3, is coated with an insulating material. This fabrication step is accomplished by maintaining a particular spatial relation between the first material layer and the incoming flux that forms the insulator. This relation is achieved by ensuring that the angle between the incoming flux and the first layer, e.g., 22 in FIG. 2, is smaller than the angle measured from the major surface of the first layer to a tangent to this layer at a point on the line, e.g., 14, defining the extremity of the area where the insulator is to be formed. In a preferred embodiment, the insulating material is deposited from a geometrically localized source (a source that is localized in space) by a ballistic method, i.e., a method that substantially avoids diffusion processes for deposition. The source is then placed in relation to the first layer so that it is not within line of sight of the area on the edge that ultimately will form the junction. That is, the source is placed so that a straight line cannot be drawn between any point of the source and any point within the desired area of the edge where the junction is to be formed. Exemplary of ballistic techniques having a localized source is secondary ion deposition and evaporation. (See J. L. Vossen and W. Kern, *Thin Film Processes*, 1978, Academic Press, page 175 and *Handbook of Thin Film Technology*, L. I. Maissel and R. Glang, 1970, McGraw Hill, respectively, for descriptions of these deposition techniques.) The material in the evaporation boat or sputtering target, respectively, defines the locus of the source. The material sputtered or evaporated, respectively, from the source follows essentially a ballistic course—a course where the material continues to move essentially from its own inertia and not from collisions with other particles—to the deposition area. In contrast, chemical vapor deposition is a diffusion controlled method. The material to be deposited is carried by a gas and arrives at the deposition substrate by diffusion.

By using a ballistic technique and the appropriate positioning of the source relative to the first material layer the desired area on the edge of the first material layer remains free of the insulating material. Because the junction edge is shielded from the material flux emanating from the source by the first material layer itself, essentially no material is deposited there.

When the insulator material to be deposited strikes the deposition area, some movement of the material occurs before it finally bonds to the deposition surface. It is generally desirable that the movement between impact and bonding is small compared to the thickness of the first material layer. This is achieved by using an insulating material that has a low surface mobility on the first layer under the deposition condition. This is determined by using a controlled sample to ensure that the use of the requisite spatial conditions results in a sharply defined edge rather than an irregular pattern. Finding a satisfactory material, such as Ge, for deposition on a Pb/In alloy in Josephson devices is not difficult. However use of SiO as the insulating material, although not precluded, is not recommended since large surface mobilities on some room temperature substrates have been observed. [See J. H. Greiner et al, *IBM Journal of Research and Development*, 24, 195 (1980).]

Since the insulating material electrically isolates the major surface of the first layer, it ensures that the junction is formed solely on the edge of the first material layer. Generally, it is possible to achieve this electrical isolation by utilizing an insulating layer thickness and composition that limits current through the insulator during operation to less than 50 percent of the total current passing through the device. A controlled sample is employed to determine the particular thickness of insulator necessary for a given application and layer composition.

If the edge or a portion of the edge of the first layer is rounded as shown in FIG. 2, or gently sloping, the spatial relation of the insulating material flux and the first layer still determines what segment of the edge is covered with insulating material. For example, if the source of insulating material is at position 11, the area 12 beyond dotted line 14 is not covered; if the source is at position 17, the uncovered area is that beyond dotted line 16. The position of the source is controlled so that the desired surface area on the edge remains uncovered.

Nevertheless, it is desirable to have a relatively sharp contour for the edge, i.e., a contour approaching a 90 degree angle. Although a rounded contour, as discussed above, is also useful, generally the electrical properties of junctions formed on such a layer are somewhat degraded because the insulator has a substantially tapered edge. At the extremity of this edge the material is no longer an adequate insulator and conduction through the insulator results at this extremity.

Figure 3:
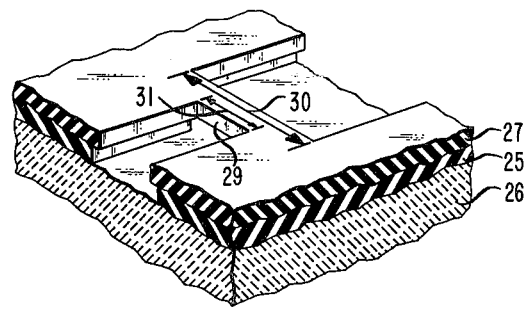

By using the above-described technique for depositing the insulating material, the edge of the first material layer need not be masked during deposition of the insulator. By eliminating this masking procedure and the associated processing, contamination is substantially reduced. The use of a delineating technique for steps other than deposition of the insulator generally is needed when a plurality of devices are produced on one substrate. In this situation it is often desirable to insulate electrically one device from another by preventing the deposition during processing of an electrically conducting layer between devices. Resist masks are generally used for this purpose. However, in a preferred embodiment, the advantages of the inventive edge-aligning technique are not affected, inadvertent connection between devices is prevented, and the edge of the first material layer remains unmasked during insulator deposition by employing a resist having suspended portions. (Exemplary of useful suspended contours is shown in FIG. 3.) These suspended portions are produced before deposition of the first material layer by techniques such as that described by G. Dolan in *Applied Physics Letters*, 31, 377 (1977). Briefly, this technique involves depositing a layer of resist, 25 in FIG. 3, upon a substrate 26. This layer is then totally exposed. The exposed resist is then overlayed with a thin layer of aluminum. The aluminum, in turn, is overlaid with a second layer of photoresist 27. The upper resist layer is exposed to leave upon development a bar, 29, with the major length 30 and minor length 31. The major length is equal to the desired width of the first material layer that it delineates. (For structural stability of the resist rectangle, generally a major length on the order of 5μ for a thickness of approximately 1μ is satisfactory.) The second resist layer is then developed and the aluminum which is uncovered after development is etched away. This uncovers the initial resist layer which is developed until the portion under the bar is dissolved. The resulting profile is shown in FIG. 3.

In the preferred embodiment, a substrate delineated by a suspended resist pattern is placed in a vacuum deposition apparatus. The method for depositing the first material is not critical. However, the resultant edge of the first layer that is to form the junction preferably should have a slope that allows deposition of the insulating material at a convenient angle, i.e., an angle of at least 30 degrees between the incoming flux and the plane of the first layer. This generally requires that the slope of the edge of the first layer as measured between the substrate and a line tangent to this edge at the point where the insulating material is to terminate should be at least 30 degrees.

Preferably, to produce the desired first layer edge, the suspended resist pattern described above is utilized and a deposition source, i.e., an evaporation source is preferably placed so that the material forming the first layer impinges on the surface essentially normal to the substrate. Evaporation by conventional techniques as described by Maissel and Glang, supra, then produces a first layer having an edge that is essentially normal to the substrate surface. Using conventional techniques such as evaporation, the thickness of the deposited layer is easily controlled to ±10 Angstroms. (See Maissel and Glang, supra.)

The insulating layer is then deposited on the first material layer as previously described. Since the spatial requirement is satisfied, the suspended resist plays no part in defining the insulating layer in the regions where the junction is to be formed. After deposition of the insulating layer by the subject edge-aligning technique, the junction is completed by conventional methods. For example, in the case of a Josephson junction, the exposed edge of a metallic first layer, e.g., a Pb/In alloy layer, is oxidized. This oxidation is achieved by a glow discharge in an oxygen plasma. [See J. L. Miles and P. H. Smith, *Journal of the Electrochemical Society*, 110, 1240 (1963).] This oxidation step is performed without removing the device being processed from the deposition apparatus and typically produces oxide layers having a conductance of at least $10^{+6}$ siemens per $cm^2$.

The oxidized edge is then covered with a second material layer by evaporation. In a preferred embodiment, the suspended resist layer is utilized and the second material layer is evaporation-deposited from a source that is within line of sight of the junction edge. The minor length 31 of the suspended bar 29 defines the width of this second layer. Since the edge is within line of sight, the second layer covers the oxide. Thus, the material covers the junction edge and extends a distance defined by the suspended resist layer. This specific definition of the width of the second resist material avoids undesirable interconnection between devices. (If only one device is being formed and there is no need to prevent the interaction of devices, the use of the suspended resist during deposition of the second layer is unnecessary.)

The following example illustrates the conditions used in the inventive process:

EXAMPLE

A sapphire substrate measuring 1 inch by 0.5 inch by 0.025 inch and with a surface flat to 1μ was cleaned with a swab in a detergent/water solution, and rinsed first in water, and then in methanol. The substrate was dried with dry nitrogen gas after being sequentially treated in a vapor degreaser with trichloroethylene, and isopropanol vapors.

Shipley AZ1350J photoresist (a proprietary product of Shipley Corporation which is a cresol formaldehyde resin-based polymer) was spun onto the substrate at 6000 rpm for 30 seconds. The substrate was then baked in air at 90 degrees C. for 30 minutes.

The resist was subjected to a blanket exposure from a mercury vapor arc lamp for 15 seconds. The substrate was placed in a vacuum deposition chamber. A boat containing aluminum was resistively heated to a temperature which produced a deposition rate of 10 Angstroms/sec as monitored by a quartz microbalance for about 10 sec to produce a 100 Angstroms layer of aluminum on the exposed resist layer. A second layer of Shipley AZ1350J resist was then spun onto the aluminum layer at 6000 rpm for 30 seconds, and the substrate was baked in air for 30 minutes at 70 degrees C.

The second resist layer was exposed to a mercury vapor arc lamp in the pattern shown in FIG. 3. A standard optical mask was used to produce this pattern. The substrate was immersed in a one-to-one solution of AZ developer in deionized water until the exposed pattern appeared fully developed. (AZ developer is a proprietary product of Shipley Corporation and is basically an aqueous sodium hydroxide solution which contains a wetting agent.) After the pattern was fully developed, the substrate was rinsed in deionized water.

The substrate was next immersed for 20 seconds in an aluminum etchant consisting of 75 percent phosphoric acid, 5 percent nitric acid, and 20 percent water, by volume which was heated to a temperature of 40 degrees C. This etchant dissolved the aluminum uncovered by the development of the upper resist layer. The substrate was rinsed in deionized water and again immersed in AZ developer. This step removed those portions of the lower layer of resist left exposed by the aluminum etching, resulting in the profile shown in FIG. 3. The substrate was then rinsed in deionized water, blown dry with dry nitrogen gas, and baked in air for 30 minutes at 70 degrees C.

The untreated surface of the substrate was attached to the substrate mount of a vacuum deposition station using Thermalcote thermal joint compound. (Thermalcote is a proprietary product of Thermalloy, Inc., that acts as a heat conductor.) The station contained three deposition sources (tungsten boats containing the material to be deposited) and a substrate mount that adjusted so that the angle between the substrate and any of the three sources was variable. A premeasured charge of 0.03 grams of an alloy consisting of 81 percent lead and 19 percent indium (by weight) was placed in one of the boats, germanium was placed in a second, and lead in the third.

The station was evacuated to a pressure of 3 microns using a mechanical roughing pump. A liquid nitrogen filled Meisner trap was used to lower the station pressure to approximately $1 \times 10^{-4}$ Torr. The station was then evacuated to $8 \times 10^{-7}$ Torr using an ion pump. All the lead-indium alloy in the first boat was evaporated with the substrate positioned parallel to the source by resistively heating the boat rapidly to a sufficiently high temperature to produce flash evaporation. This produced a first material layer 800 Angstroms thick. The substrate was then tilted so that the angle denominated 22 in FIG. 2 was 65 degrees with respect to the second source. Then 100 Angstroms of insulating germanium was deposited on it by heating the second boat to a temperature that produced a deposition rate of about 10 Angstroms/sec. Following the germanium deposition, the substrate was returned to the zero degree tilt position.

Dry oxygen was admitted through a leak valve to a pressure of 7 microns and the pressure was maintained using a roughing pump. The deposited films were oxidized for 4 minutes in a plasma struck in the oxygen atmosphere with a DC power supply operating at 1.1 KV and 7 mA. At the end of 4 minutes, the plasma was extinguished and the station again evacuated to a pressure of $8 \times 10^{-7}$ Torr.

For deposition of the counterelectrode, the substrate was tilted so that angle 22 in FIG. 2 was 128 degrees with respect to the third boat and 1200 Angstroms of lead were deposited at a rate of about 60 Angstroms/sec. The station was vented to atmospheric pressure with dry nitrogen gas, and the substrate removed. The resists and unwanted deposition material were removed by immersing the substrate in acetone for 15 minutes. This acetone strip was followed by a methanol rinse, and the substrate was then blown dry with dry nitrogen gas. The resulting device, formed by the overlap of the lead counterelectrode with the oxidized edge of the lead-indium base electrode, has an active area of approximately 1 micron by 0.08 micron. The device exhibited a resistance of approximately 100 ohms.

We claim:

1. A process for forming a junction device comprising the steps of depositing a first material layer, depositing an insulating material on a portion of said first material layer by impingement of a flux on said first material layer, and forming said junction device on an exposed portion of said first material layer characterized in that said junction device is formed on an edge of said first material layer by an edge aligning technique comprising the steps of positioning said first material layer relative to said flux such that the angle between said flux and said first material layer is smaller than the angle from the major surface of said first material layer to a line tangent to this layer at a point on the boundary line defining the extremity of the area where said insulating material is to be formed.

2. The process of claim 1 wherein said first material layer comprises a Pb/In alloy.

3. The process of claim 1 wherein said edge aligning technique comprises employing a ballistic deposition technique wherein the source of said insulating material used in said ballistic deposition technique is positioned so that a straight line path between said edge and said source is absent.

4. The process of claim 3 wherein said ballistic deposition method is an evaporation method.

5. The process of claim 3 wherein said ballistic deposition method is a secondary ion method.

6. The process of claim 1 wherein said insulating material is Ge.

7. The process of claim 1 including the step of defining said first material layer with a suspended portion of a delineating material.

8. The process of claim 1 including the step of forming said junction by using a suspended portion of a resist material.

9. The process of claim 1 including the step of forming said junction by oxidizing said edge.

10. The process of claim 9 including the step of depositing a metal on said oxidized edge.

11. The process of claim 10 wherein said metal comprises lead.

* * * * *